(12) United States Patent
Idenishi (10) Patent No.: US 7,374,435 B2
(45) Date of Patent: May 20, 2008

(54) CONNECTING DEVICE OF A FLEXIBLE PRINTED CIRCUIT BOARD

(75) Inventor: Naohiro Idenishi, Tottori (JP)

(73) Assignee: Epson Imaging Devices Corporation, Nagano (JP)

( * ) Notice: Subject to any disclaimer, the term of this patent is extended or adjusted under 35 U.S.C. 154(b) by 0 days.

(21) Appl. No.: 11/324,310

(22) Filed: Jan. 4, 2006

(65) Prior Publication Data

US 2006/0160410 A1 Jul. 20, 2006

(30) Foreign Application Priority Data

Jan. 17, 2005 (JP) ............................. 2005-008667

(51) Int. Cl.
*H01R 12/00* (2006.01)
(52) U.S. Cl. .......................................... 439/77; 439/67
(58) Field of Classification Search ................. 439/67, 439/77, 495, 496; 174/254; 361/749
See application file for complete search history.

(56) References Cited

U.S. PATENT DOCUMENTS

| | | |
|---|---|---|
| 3,189,864 A | 6/1965 | Angele et al. |
| 3,295,365 A | 1/1967 | Basile |
| 4,917,613 A | 4/1990 | Kabadi |
| 5,669,775 A * | 9/1997 | Campbell et al. ............. 439/77 |
| 5,846,094 A | 12/1998 | Murray et al. |
| 5,904,589 A * | 5/1999 | Asakawa .................... 439/495 |
| 5,967,831 A * | 10/1999 | Yamada et al. ............. 439/496 |
| 6,017,222 A | 1/2000 | Kao |
| 6,089,905 A | 7/2000 | Shimmyo et al. |

(Continued)

FOREIGN PATENT DOCUMENTS

CN 1250239 A 4/2000

(Continued)

OTHER PUBLICATIONS

"Flex Attachment to a Printed Circuit Card", IBM Technical Disclosure Bulletin, Apr. 1991, pp. 182-183, vol. 22 No. 11, IBM Corp., New York, US.

(Continued)

*Primary Examiner*—Khiem Nguyen
(74) *Attorney, Agent, or Firm*—McDermott Will & Emery LLP (57) ABSTRACT

A connecting device of a flexible printed circuit board has a reinforced backlight FPC board, is free from bad contact resulting from insufficient insertion of a terminal portion of a flexible printed circuit board into a connector, and ensures good connection without leaving contaminants, scratches, or the like on contacts of the terminal portion. The connecting device of a flexible printed circuit board has a terminal portion having a contact formed as a printed conductor in a tip end portion of a film-form flexible printed circuit board, and a connector having an insertion slot into which the terminal portion is inserted and a contact fitted inside the insertion slot and connected to the contact of the terminal portion. Moreover, a reinforcing plate is bonded on the face of the terminal portion opposite to the face thereof on which the contact is formed, and an ear-like piece that makes contact with the opening rim of the insertion slot in the connector is formed in a position a predetermined distance inward from the tip end of the terminal portion in the length direction of the flexible printed circuit board.

6 Claims, 9 Drawing Sheets

U.S. PATENT DOCUMENTS

| | | | |
|---|---|---|---|
| 6,146,189 A | * | 11/2000 | Nomura et al. ............ 439/493 |
| 6,422,885 B2 | | 7/2002 | Kain et al. |
| 2001/0019912 A1 | | 9/2001 | Kain et al. |

FOREIGN PATENT DOCUMENTS

| | | | |
|---|---|---|---|
| GB | 1-236-288 | | 6/1971 |
| JP | 09-022760 | | 1/1997 |
| JP | 09-129307 | | 5/1997 |
| JP | 2000277880 A | * | 10/2000 |
| JP | 2003-017823 A | | 1/2003 |
| JP | 2003101167 A | * | 4/2003 |
| JP | 2004-252339 A | | 9/2004 |
| KR | 0356307 | | 7/2004 |
| KR | 10-2005-0098078 | | 10/2005 |
| WO | WO 2004/034510 A1 | | 4/2004 |

OTHER PUBLICATIONS

European Search Report, issued in corresponding European Patent Application EP 05026961, dated Jun. 13, 2006.

* cited by examiner

CONNECTING DEVICE OF A FLEXIBLE PRINTED CIRCUIT BOARD

The present application claims the benefit of patent application No. 2005-8667, filed in Japan on Jan. 17, 2005, the subject matter of which is hereby incorporated herein by reference.

BACKGROUND OF THE INVENTION

1. Field of the Invention

The present invention relates to a connecting device of a flexible printed circuit board. More particularly, the present invention relates to a connecting device in which a terminal portion of a flexible printed circuit board to be connected to a connector has an improved terminal portion, and especially to one suitable for use in a liquid crystal display apparatus.

2. Description of Related Art

Liquid crystal display apparatuses are widely used as displays in various electronic appliances such as cellular phones, video cameras, notebook personal computers, electronic dictionaries, and television monitors.

A liquid crystal display apparatus is composed of a liquid crystal display panel having liquid crystal sealed therein, a backlight unit for illuminating the display panel, and a control circuit for controlling them.

In recent years, various electronic appliances, in particular cellular phones, have come to be required to offer high performance and high functionality in combination with compactness, lightweight, slimness, and resistance to vibration, shock, and the like, while a large number of electronic components are built in such appliances at high densities and are connected together via printed circuit boards.

As such printed circuit boards, flexible printed circuit boards (hereinafter referred to as FPC boards) are often used, which are generally lightweight and easy to lay in complicated patterns.

Figure 6:
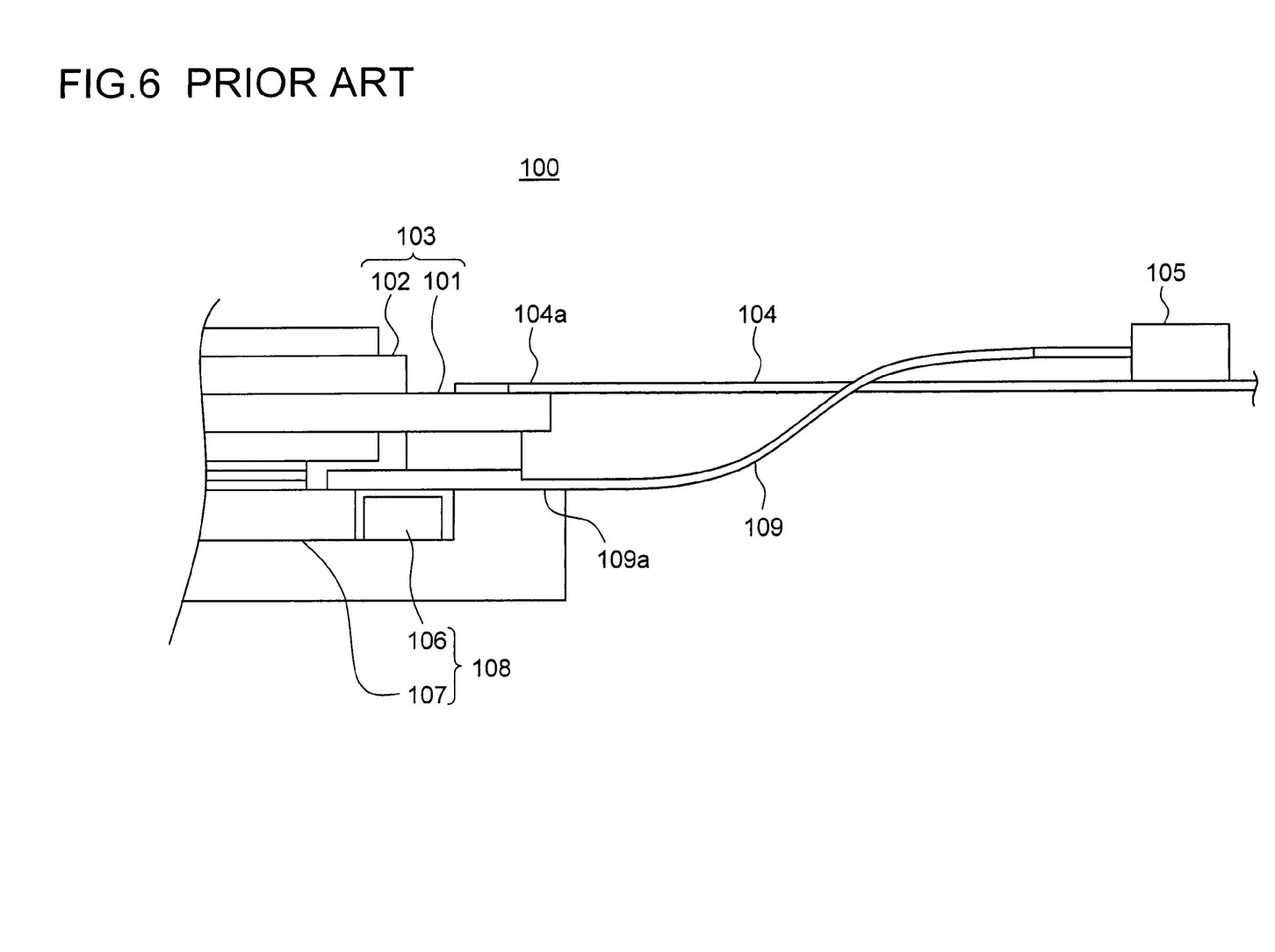
FIG. 6 is a partial side view showing a conventional liquid crystal display apparatus.

FIG. 6 is a partial side view showing a conventional liquid crystal display apparatus employing such an FPC board.

This liquid crystal display apparatus 100 is provided with a liquid crystal display panel 103 and a backlight unit 108 for illuminating the liquid crystal display panel 103. The liquid crystal display panel 103 is provided with an array substrate 101 having thin-film transistors and transparent pixel electrodes formed in a matrix-like pattern thereon and a color substrate 102 having color filters, electrodes, and the like thereon. The array substrate 101 and the color substrate 102 are arranged to face each other, and a liquid crystal layer (unillustrated) is formed between them.

Of the array substrate 101 and the color substrate 102, the array substrate 101 has electrodes extending therefrom at one side edge thereof. These electrodes are connected to a flexible FPC board (hereinafter referred to as the driving FPC board) 104 so as to receive, from outside, a supply voltage and a video signal with which to drive the thin-film transistors.

The backlight unit 108 is provided with a light source 106 and a light guide plate 107 for directing the light from the light source 106 so as to illuminate the liquid crystal display panel 103. The light source 106 is connected to an FPC board (hereinafter referred to as the backlight FCP board) 109 so as to receive, from outside, a supply voltage.

The liquid crystal display panel 103 and the backlight unit 108 each have a predetermined thickness, and thus, when they are laid together, the driving FPC board 104 and the backlight FCP board 109 has a level difference between the respective connected end portions 104a and 109a in the direction of the thickness of the boards laid together. Thus, when the FPC boards 104 and 109 are laid together and bent toward the back face of the backlight unit 108, because of the level difference, the backlight FCP board 109 is bent with a sharper bending curve, that is, a smaller curvature (R), than the driving FPC board 104.

When the two FPC boards 104 and 109 are bent with different curvatures, bending them causes the following inconveniences. If the lengths of the driving FPC board 104 and the backlight FCP board 109 are adjusted when they are in a rectilinearly straightened state, and they are then bent, the backlight FCP board 109 so slides as to lose the place to go and thus so bends as to bulge upward.

Such bulging requires an extra space to be secured to allow for it when an apparatus is designed. This makes it difficult to make the apparatus compact, and makes interference with an obstacle likely.

By contrast, if the lengths of the two FPC boards 104 and 109 are adjusted when they are in a previously bent state, and the tip end of the backlight FCP board 109 is connected to a connector 105, straightening them from the bent state to a rectilinearly straightened state may cause the backlight FCP board 109 to be so pulled as to come off the connector 105.

Figure 7:
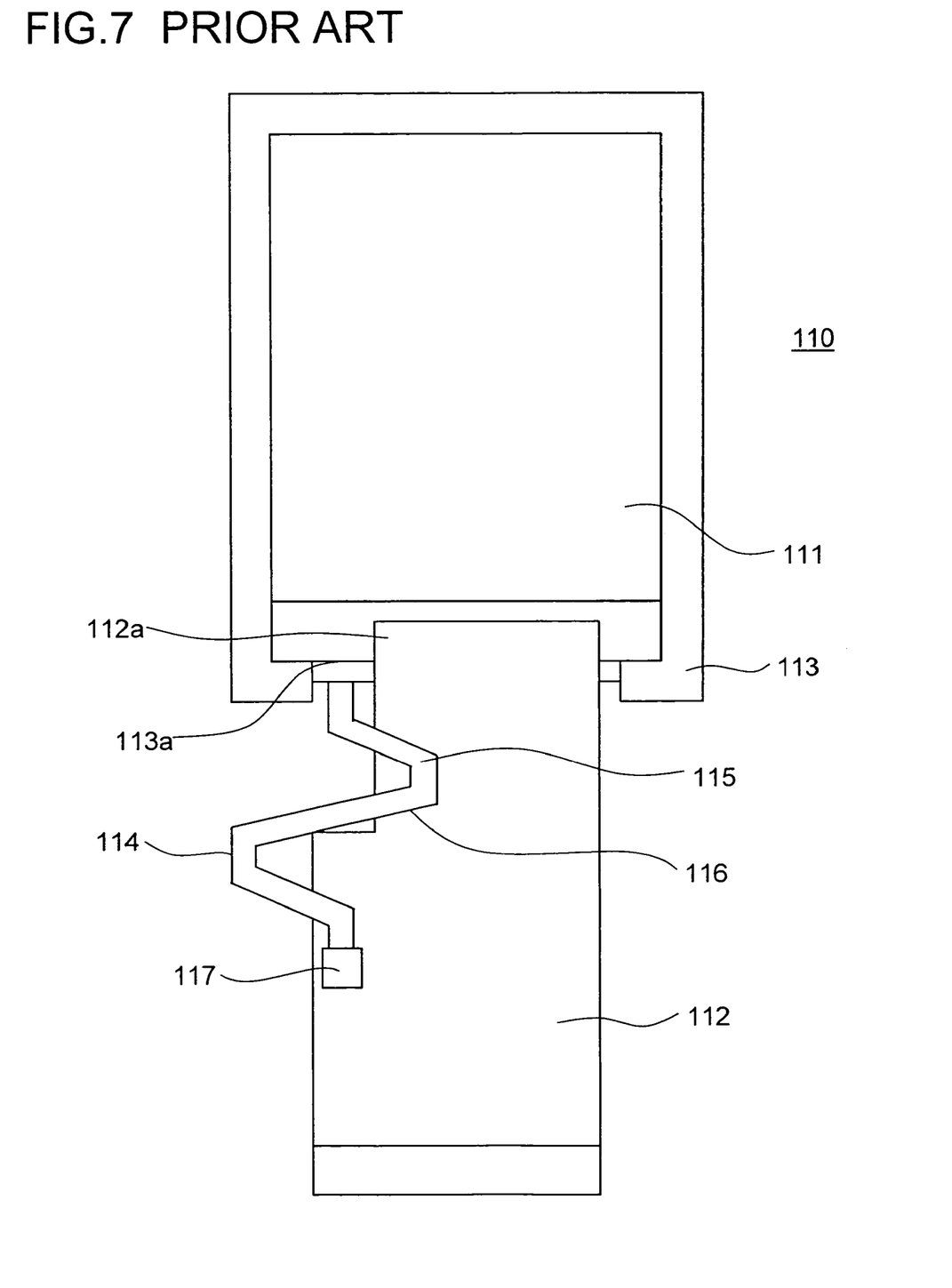
FIG. 7 is a front view of another conventional liquid crystal display apparatus.

A liquid crystal display apparatus has been proposed that is so devised as to overcome the above inconveniences (Japanese Patent Application Laid-open No. 2004-252339 (see FIG. 2 and paragraphs [0024] to [0029]). FIG. 7 is a front view of the liquid crystal display apparatus disclosed in this publication.

This liquid crystal display apparatus 110 is provided with a liquid crystal display panel 111 and a backlight unit 113 for illuminating the liquid crystal display panel 111. A driving FPC board 112 is connected to the liquid crystal display panel 111 at one side edge thereof, and, in a position away from a connected end portion 112a of the driving FPC board 112, a connecting piece portion 113a is provided that is connected to a light emission source (unillustrated). To this connecting piece portion 113a, a backlight FPC board 114 is connected. This backlight FPC board 114 has a central portion 116 of a main portion 115 thereof formed roughly in the shape of "S".

As a result of the central portion 116 of the backlight FPC board 114 being formed in the shape of "S", it can expand and contract in the length direction thereof. Thus, even when the FPC boards 112 and 114 are bent and straightened, the backlight FPC board 114 is prevented from bulging or coming off a connector 117.

A terminal portion at a tip end of such an FPC board is usually connected to a detachable connector (see Japanese Patent Application Laid-open No. H9-22760, FIGS. 3 and 4, and paragraphs [0002] to [0004]).

Figure 8A:
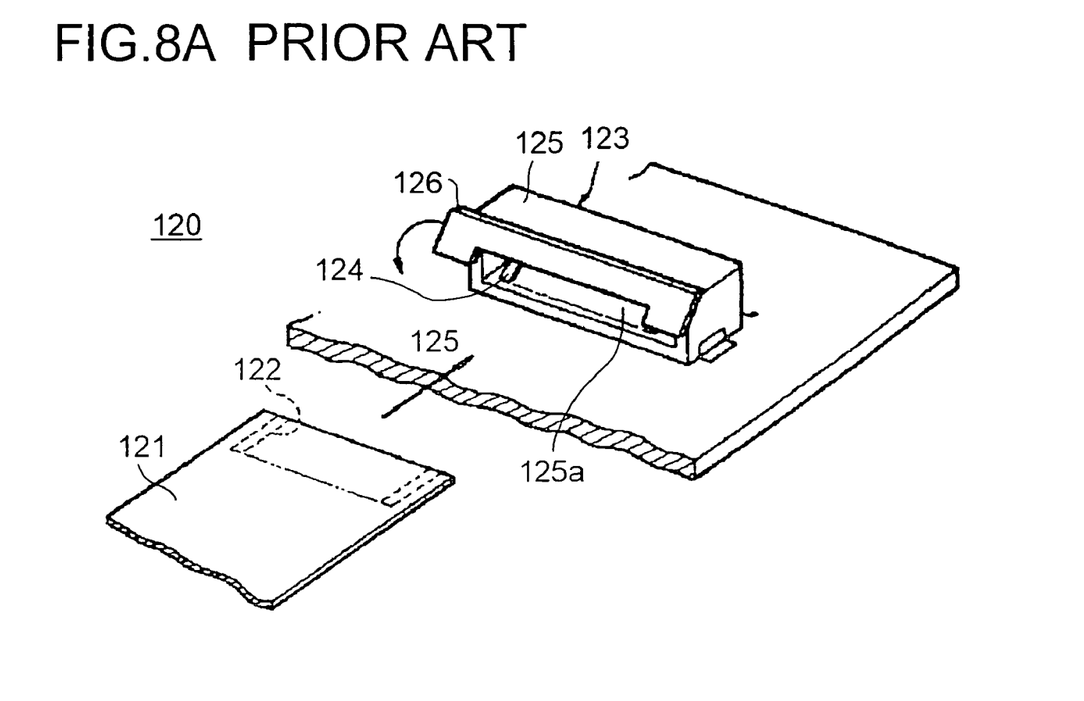
FIGS. 8A and 8B are a perspective view and a sectional view, respectively, of a conventional connecting device.
Figure 8B:
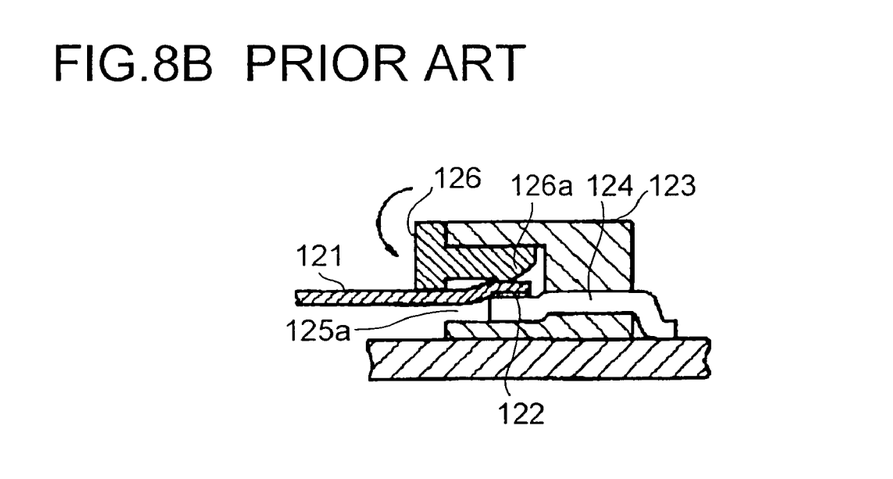

FIGS. 8A and 8B show the connecting device disclosed as prior art in this publication, FIG. 8A being a perspective view thereof, and FIG. 8B a sectional view in the direction perpendicular to the board surface shown in FIG. 8A.

This connecting device 120 is composed of a terminal portion 122 formed in an end portion of an FPC board 121 and a connector 123 into which the terminal portion 122 is inserted so as to be connected thereto. The connector 123 is formed as an elongate box-shaped housing 125 that has, formed in the front face thereof, an insertion slot 125a into which the terminal portion 122 is inserted and that also has, fitted in an inner portion inside the insertion slot 125a, a plurality of contacts 124. The connector 123 is further provided with pressing means 126 for fixing the terminal portion 122 in the insertion slot 125*a*.

The connecting device 120 structured as described above works in the following manner. When the terminal portion 122 of the FPC board 121 is inserted into the insertion slot 125*a*, the contacts 124 of the connector 123 make contact with and thus conduct to the terminal portion 122 of the FPC board 121. In this state, when the pressing means 126 of the connector 123 is rotated in the closing direction, a pressing projection 126*a* thereof presses the FPC board 121 toward the contacts 124 as shown in FIG. 8B so that the terminal portion 122 of the FPC board 121 and the contacts 124 are pressed against each other and thereby connected and fixed together. In this way, the FPC board 121 is held on the board, and simultaneously the terminal portion 122 conducts, via the contacts 124 of the connector 123, to the printed circuit on the board.

Inconveniently, any of the FPC boards described thus far has the following disadvantages. The FPC board is formed as a strip-shaped member formed of very thin polyimide film or the like and having varying widths. Thus, the FPC board is extremely difficult to insert into an insertion slot, and requires skilled work for its connection to a connector. The reason is as follows. The FPC board, even in the terminal portion thereof, simply has contacts printed on a board in the form of film. Thus, the FPC board is, even at the tip end thereof, soft like, for example, a tip end of a piece of cloth, and tends to droop. Thus, even if an assembly worker, when inserting the FPC board into an insertion slot, attempts to do so after first determining the right direction, he takes time trying different insertion directions because he needs to vary the positioning of the tip portion, confirm the degree of insertion, and repeat those operations many times before achieving successful insertion into the insertion slot. The difficulty may be alleviated, as actually practiced, by bonding a reinforcing member on the face of the terminal portion opposite to the face thereof on which the contacts are provided with a view to making the terminal portion more rigid. Even when this is practiced, insertion is still considerably difficult.

The terminal portion has varying widths, and the above-described backlight FPC board has an especially small width, for example as small as about 2 mm. This makes insertion into an insertion slot more difficult.

Moreover, even when the terminal portion is inserted into the insertion slot, since the shape of the terminal portion is indefinite as described above, it is difficult to confirm whether the terminal portion has been inserted up to the right position, and, if not, bad contact may result. Such insufficient insertion may go undetected through electrical conduction inspection performed after assembly, causing disconnection resulting from vibration or the like during use, and thus leading to failure of an appliance.

Moreover, connection to a connector is achieved through work using human fingers or a tool. During this work, the fingers or tool may make contact with the contacts of the terminal portion, leaving contaminants, scratches, or the like on the surface of the contacts, and thus leading to bad contact.

SUMMARY OF THE INVENTION

In view of the conventionally experienced inconveniences and disadvantages discussed above, it is an object of the present invention to provide a connecting device of a flexible printed circuit board that has a reinforced backlight FPC board, that is free from bad contact resulting from insufficient insertion of a terminal portion of a flexible printed circuit board into a connector, and that ensures good connection without leaving contaminants, scratches, or the like on contacts of the terminal portion.

To achieve the above object, according to the present invention, in a connecting device of a flexible printed circuit board, a reinforcing plate is bonded on the face of a terminal portion opposite to the face thereof on which a contact is formed, and an ear-like piece that makes contact with the opening rim of an insertion slot in a connector is formed in a position a predetermined distance inward from the tip end of the terminal portion in the length direction of the flexible printed circuit board.

By bonding a reinforcing plate in a terminal portion of a flexible printed circuit board and forming an ear-like piece in the reinforcing plate as described above, it is possible, when the flexible printed circuit board is connected to a connector, to confirm how deep it has been inserted into an insertion slot of the connector, that is, to confirm, based on insertion depth, whether or not a contact of the terminal portion and a contact of the connector have been properly connected together. Thus, it is possible to prevent bad connection resulting from insufficient insertion.

Alternatively, according to the present invention, in a connecting device of a flexible printed circuit board, a reinforcing plate is bonded on the face of a terminal portion opposite to the face thereof on which a contact is formed, and the reinforcing plate is dagger-shaped so as to have an ear-like piece formed in a position a predetermined distance inward from the tip end of the terminal portion in the length direction of the flexible printed circuit board.

By bonding a reinforcing plate in a terminal portion of a flexible printed circuit board, forming an ear-like piece in the reinforcing plate as described above, and making the reinforcing plate dagger-shaped as described above, it is possible to make connection to a connector easy and increase workability.

DETAILED DESCRIPTION OF PREFERRED EMBODIMENTS

Hereinafter, with reference to the accompanying drawings, the best mode of carrying out the present invention will be described. It should however be understood that the embodiment described below is simply meant to present an example of a connecting device as embodying the technical idea of the present invention, and is therefore not meant to limit the application of the present invention to such a connecting device; that is, many variations and modifications are possible within the scope and spirit of the appended claims.

First Embodiment

Figure 1:
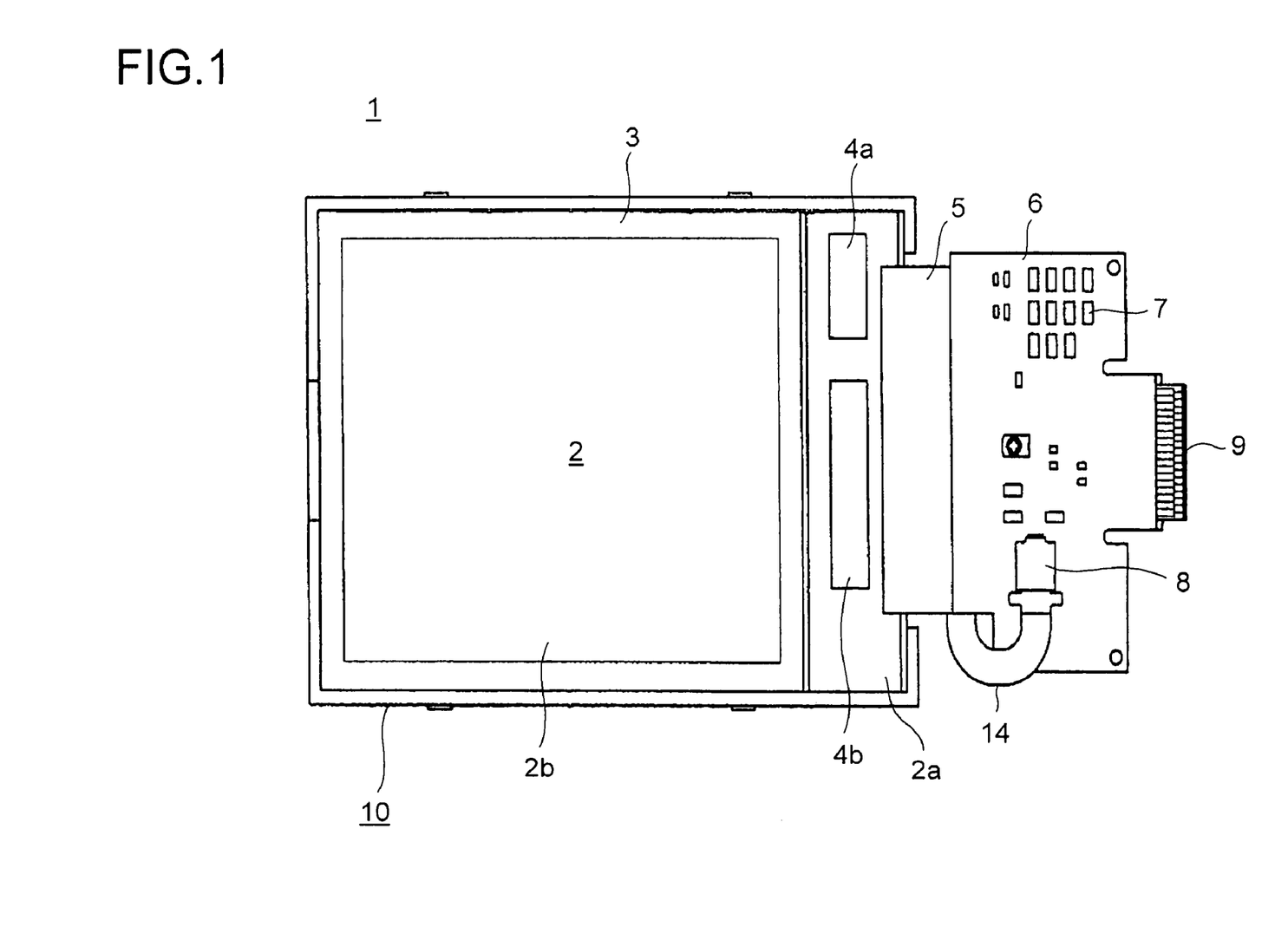
FIG. 1 is a front view of the FPC board of a first embodiment of the present invention, as applied to a liquid crystal display apparatus.
Figure 2:
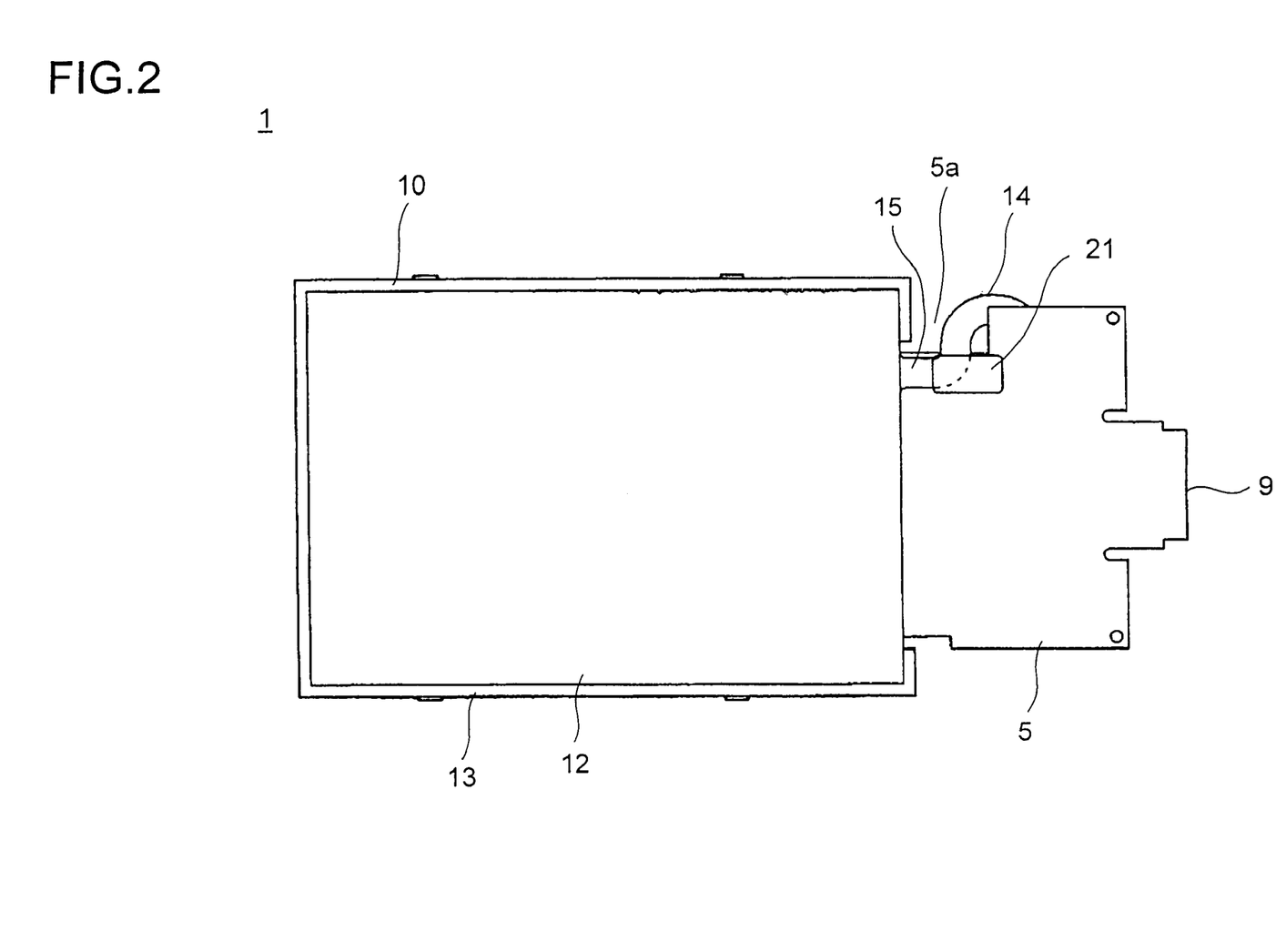
FIG. 2 is a rear view of the liquid crystal display apparatus shown in FIG. 1.
Figure 3:
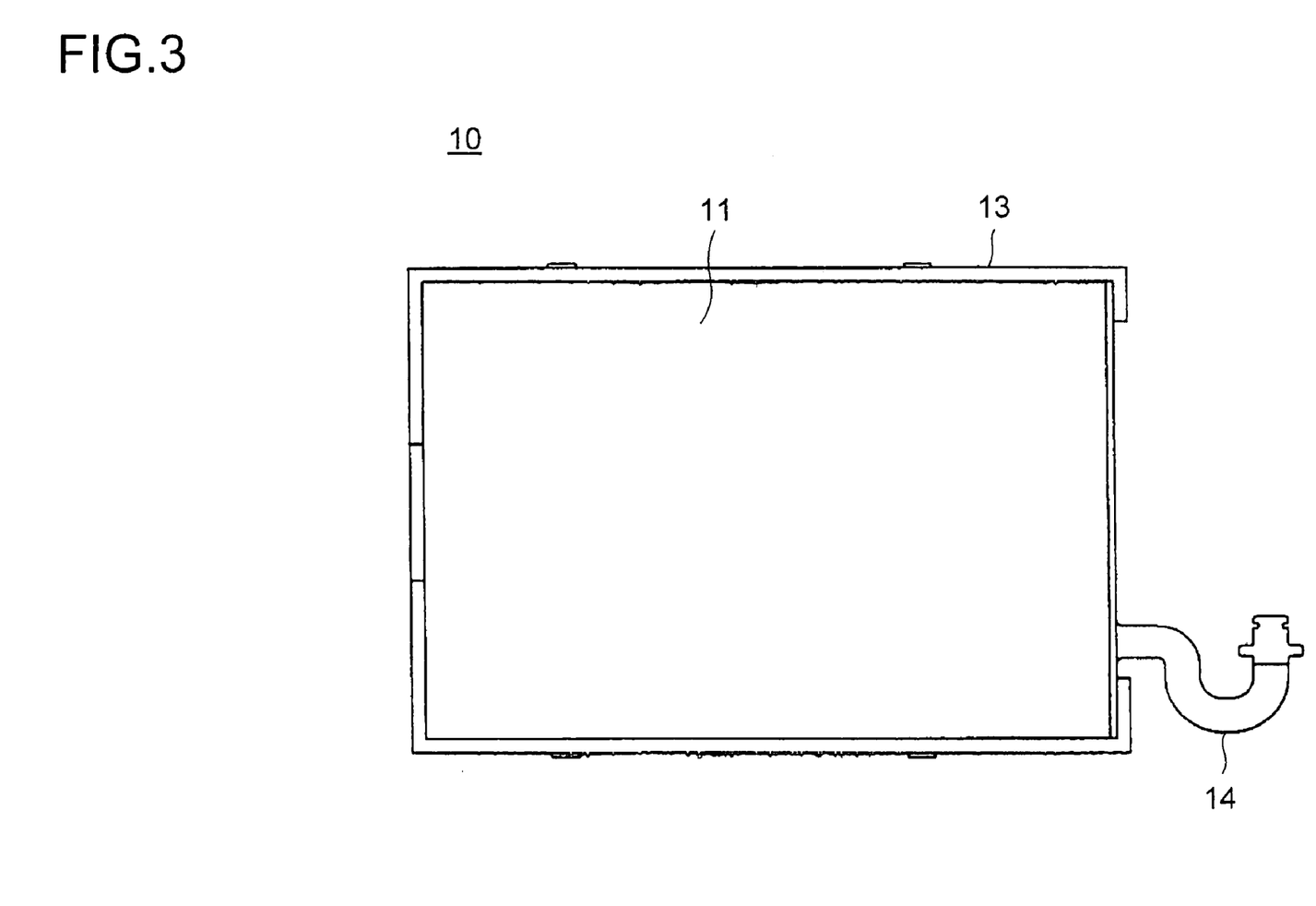
FIG. 3 is a front view of a backlight unit.
Figure 4A:
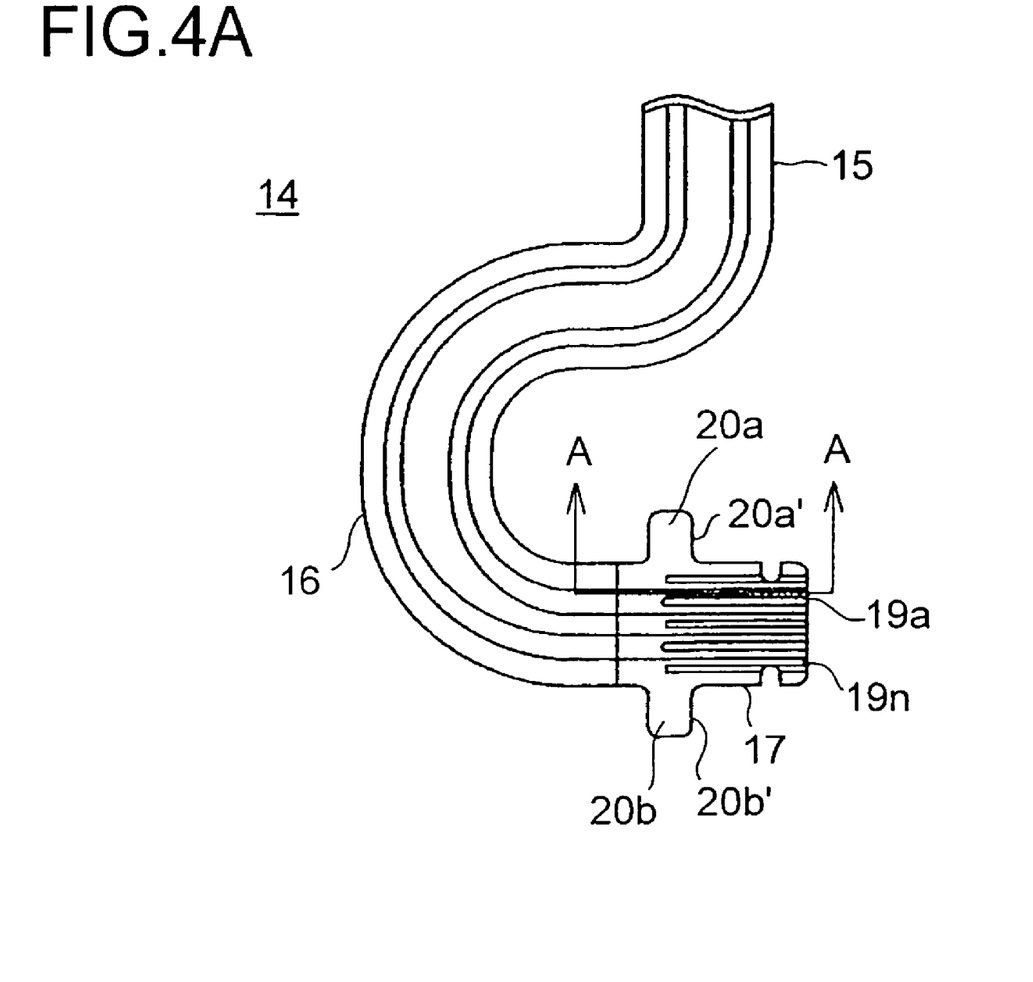
FIG. 4A is a front view of the backlight FPC board used in the backlight unit shown in FIG. 3.
Figure 4B:
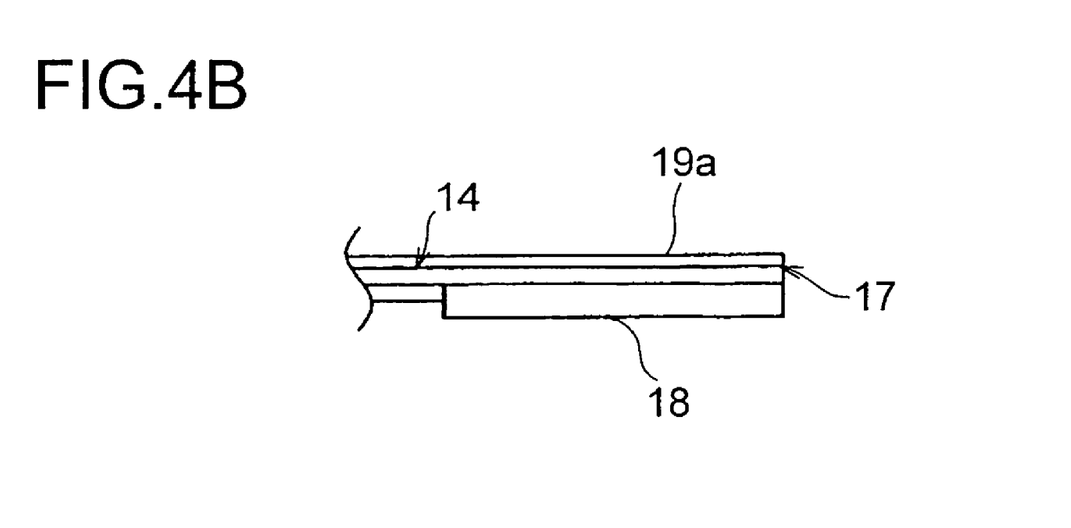
FIG. 4B is a sectional view along line A—A shown in FIG. 4A.
Figure 4C:
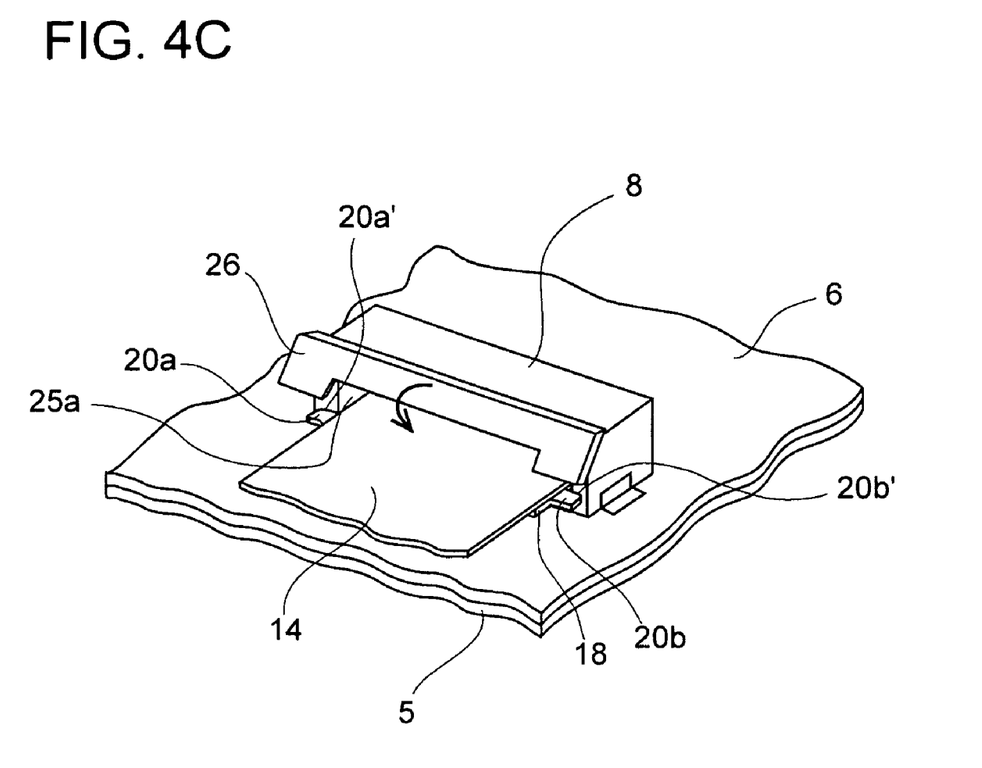
FIG. 4C is a perspective view showing a state in which a terminal portion of the backlight FPC board is inserted into a connector.
Figure 5A:
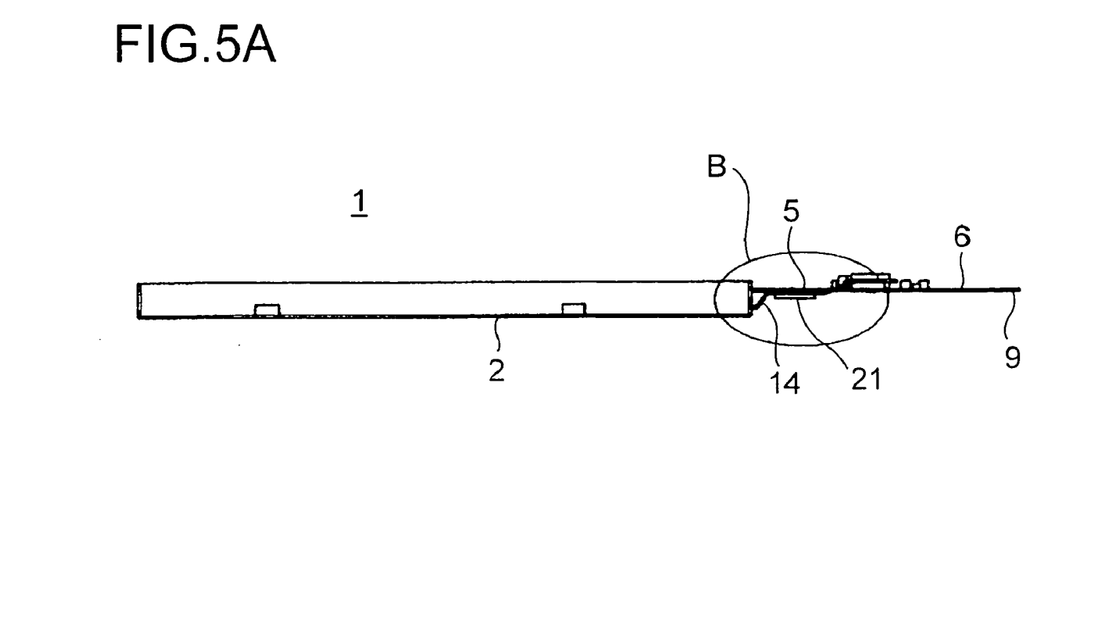
FIG. 5A is a side view of FIG. 1.
Figure 5B:
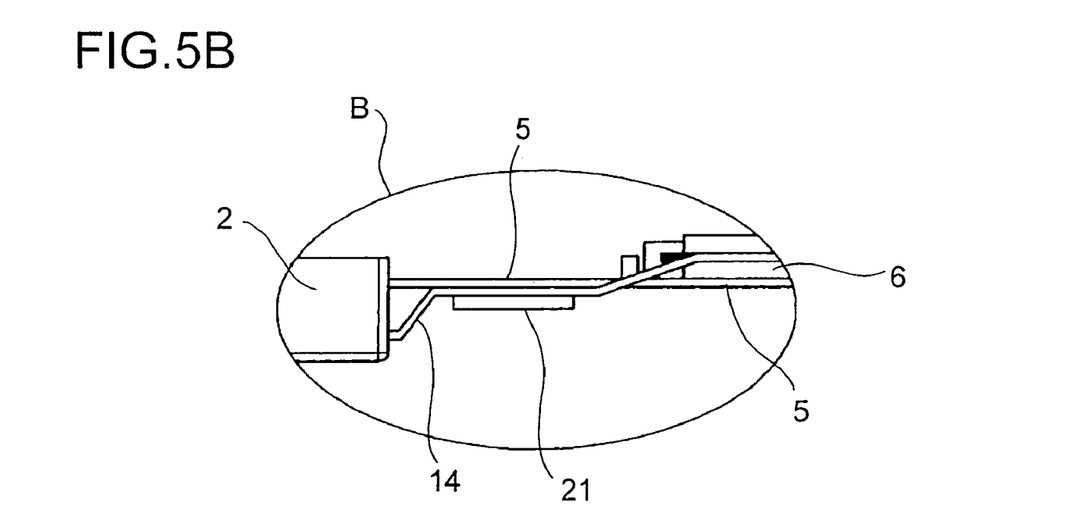
FIG. 5B is an enlarged view of part B shown in FIG. 5A.

FIG. 1 is a front view of a connecting device in an FPC board of a first embodiment of the invention, as applied to a liquid crystal display apparatus. FIG. 2 is a rear view of the liquid crystal display apparatus shown in FIG. 1. FIG. 3 is a front view of a backlight unit. FIG. 4A is a front view of the backlight FPC board used in the backlight unit shown in FIG. 3, FIG. 4B is a sectional view along line A—A shown in FIG. 4A, and FIG. 4C is a perspective view showing a state in which a terminal portion of the backlight FPC board is inserted into a connector. FIG. 5A is a side view of FIG. 1, and FIG. 5B is an enlarged view of part B shown in FIG. 5A.

As shown in FIGS. 1 and 2, the liquid crystal display apparatus 1 is provided with a liquid crystal display panel 2 and a backlight unit 10 for illuminating the liquid crystal display panel 2. The liquid crystal display panel 2 is provided with an array substrate 2a having thin-film transistors and transparent pixel electrodes formed in a matrix-like pattern thereon and a color substrate 2b having color filters and the like thereon. The array substrate 2a and the color substrate 2b are arranged to face each other, and a liquid crystal layer (unillustrated) is formed between them. Of these two substrates 2a and 2b facing each other, the array substrate 2a has, mounted in an edge portion thereof, semiconductor chips 4a and 4b for driving the liquid crystal. Conductors are led out of these chips, and are connected to a flexible driving FPC board 5.

This FPC board 5 has conductors printed in a predetermined pattern on a comparatively wide strip-like member formed of very thin polyimide film or the like, and has a terminal portion 9 formed at the tip end thereof. To the surface of the FPC board 5, a printed circuit board 6 having semiconductor chips 7, a connector 8, and the like mounted thereon is bonded. This printed circuit board 6 is formed of a flexible material thicker than the FPC board 5, and the semiconductor chips 7, the connector 8, and the like are connected to conductors on the driving FPC board 5.

The driving FPC board 5 is, in the terminal portion 9 thereof, connected to an external interface circuit board (unillustrated) so that the liquid crystal display panel 2 is fed with a supply voltage and a video signal from outside.

As shown in FIGS. 2 and 3, the backlight unit 10 is provided with a light source (unillustrated), a light guide plate 11 for directing the light from the light source so as to illuminate the liquid crystal display panel, a reflective plate 12, and a frame member 13 for housing those members. To the light source, a backlight FPC board 14 is connected, and this FPC board 14 is lead out of the frame member 13. The backlight FPC board 14 is fitted to the backlight unit 10 in such a way that a rectilinear base portion 15, which will be described later, lies on the back face of the driving FPC board 5.

As shown in FIG. 4A, the backlight FPC board 14 has conductors printed in a predetermined pattern on a narrow string-shaped member formed of very thin polyimide film or the like, and is composed of a rectilinear base portion 15 connected to the light source, a curved portion 16 extending from the base portion 15, and a terminal portion 17 formed at the tip end of the curved portion 16.

Of these different portions, the curved portion 16 is formed roughly in a semicircular or semielliptic shape so that it can expand and contract in the length direction. Forming the curved portion 16 in a semicircular or semielliptic shape offers the following advantages. On occasions such as the assembly of the connecting device or the attachment or detachment of the terminal portion 17 to or from the connector 8, even if the flexible printed circuit board is pulled, the curved portion 16 absorbs the pulling force so that it does not act on the terminal portion 17 of the base portion 15 connected to the liquid crystal display panel. This helps prevent bad contact at the terminal portion 17. Moreover, the curved portion 16 has no pointed corners or V-shaped serrations as found in the prior art. This helps prevent ripping or breakage.

The tip end of the curved portion 16 is so bent as to be roughly parallel to an end edge of the backlight unit 10, and, as shown in FIG. 4A, in the terminal portion 17 formed at that tip end, a plurality of contacts 19a to 19n are arranged parallel to one another. Moreover, as shown in FIG. 4B, on the rear face of the terminal portion 17, a reinforcing plate 18 thicker than the backlight FPC board 14 is bonded. Bonding the reinforcing plate 18 helps reinforce the film-form terminal portion 17, and makes its connection to a connector easy.

As shown in FIGS. 4A. 4B, and 4C, in the reinforcing plate 18, ear-like pieces 20a and 20b of the terminal portion are formed one in each side-edge portion of the terminal portion 17, in a position a predetermined distance inward from the tip end of the terminal portion 17 in the length direction of the backlight FPC board 14. The ear-like pieces 20a and 20b are formed in such a position as to permit, when the terminal portion 17 is inserted into an insertion slot of a connector, the contacts 19a to 19n of the terminal portion 17 to make good contact with contacts inside the connector. The ear-like pieces 20a and 20b are formed as projecting pieces having a predetermined width outward from each side-edge portion of the flexible printed circuit board, and, as a result of the ear-like pieces 20a and 20b, at one side ends 20a' and 20b' thereof, making contact with the opening rim of the insertion slot of the connector, the contacts 19a to 19n of the terminal portion 17 are kept in good contact with the contacts inside the connector. Moreover, the ear-like pieces 20a and 20b are formed so wide as to be holdable between human fingers or with a comparable tool, for example about 10 mm in the length direction and about 10.35 mm in the perpendicular direction, and thus form a dagger-like shape. With this portion held between fingers or with a tool, insertion can be performed with increased workability.

The FPC board 14 provided with the terminal portion 17 structured as described above is connected to, for example, a connector 8 as shown in FIG. 4C. The connector 8 has the same structure as the connector 123 shown, for example, in FIGS. 8A and 8B, and has pressing means 26 for fixing the terminal portion 17.

Next, the procedure for assembling the liquid crystal display apparatus 1 will be described.

First, as shown in FIGS. 5A and 5B, the backlight FPC board 14 is straightened in the length direction, and then the curved portion 16 is laid from the back face of the driving FPC board 5 over to the top face thereof via a cut-out portion 5a formed in the driving FPC board 5. Then, preferably, the base portion 15 and the printed circuit board 6 are bonded together with reinforcing tape 21. This reinforcing tape 21 is applied in a position where it does not interfere with the space where the driving FPC board 5 is bent. Applying the reinforcing tape 21 helps eliminate the warping and space that have conventionally been inevitable to a certain degree when the backlight FPC board 14 is bent.

Thereafter, the terminal portion 17 of the backlight FPC board 14 is pulled in the length direction and is connected to the connector 8.

Connection to this connector is achieved, while the ear-like pieces 20a and 20b of the terminal portion 17 are held between human fingers or with a tool, by inserting the terminal portion 17 into the insertion slot 25a of the connector 8 until the projections, at one side ends 20a' and 20b' thereof, make contact with the opening rim of the insertion slot. This contact helps confirm secure insertion. Moreover, connection to the connector 8 is achieved without touching the contacts 19a to 19n of the terminal portion 17 between fingers or with a tool but by using the ear-like pieces. Thus, good connection can be achieved without leaving contaminants, scratches, or the like on the contacts 19a to 19n.

After connection to the connector, the driving FPC board 5 and the backlight FPC board 14 are laid together, and are bent so as to be fitted to the back face of the frame member 13 of the backlight unit 10.

Here, the backlight FPC board 14 is connected to the connector 8 after it has previously been straightened, and thus, after bending, the deviation of the connection position resulting from the thickness of the backlight FPC board 14 itself is cancelled by the contraction of the curved portion 16. This prevents the backlight FPC board 14 becoming slack.

The backlight FPC board 14 connected to the backlight unit 10 and formed in the shape of a narrow string is bent by making contact with the surface of the driving FPC board 5 formed in the shape of a wide strip. Thus, in the position where they are bent, the backlight FPC board 14 formed in the shape of a narrow string is bent to lie along the curvature of the driving FPC board 5 while keeping intimate contact with the surface of the driving FPC board 5 in the shape of a wide strip.

The backlight FPC board 14 is formed of a thin (film-form) narrow string-shaped base material, and is mechanically extremely weak. As a result of being bent as described above, however, it is kept in contact with and thereby supported by the driving FPC board 5 in the shape of a wide strip, and is thus prevented from suspending in the air. Thus, it is possible to prevent the backlight FPC board 14 from interfering with an obstacle on occasions such as the assembly of the connecting device, and thereby to prevent the printed circuit board 6 from being damaged or broken as a result of such interference or the like. Likewise, when the connecting device is in use, the above-described support-by-contact inhibits free movement, and thus prevents the printed circuit board 6 from being damaged or broken as a result of it touching or rubbing against an edge portion of the housing under vibration or the like.

Furthermore, the terminal portion 17 of the backlight FPC board 14 points in the direction parallel to an end edge of the liquid crystal display panel 2, and thus connection of the terminal portion 17 to the connector 8 is achieved through insertion and extraction in the direction parallel to the end edge of the liquid crystal display panel 2. Thus, no force is applied directly to the portion where the base portion 15 is connected to the liquid crystal display panel. This helps prevent bad connection in that portion.

What is claimed is:

1. A connecting device of a flexible printed circuit board comprising:
    a backlight flexible printed circuit board having one end portion thereof connected to a backlight unit for illuminating a display panel and another end portion thereof led out therefrom; and
    a driving flexible printed circuit board having one end portion thereof connected to the display panel for driving the display panel and the other end portion thereof led out therefrom and having a connector to which the other end portion of the backlight flexible printed circuit board is connected,
    wherein the backlight flexible printed circuit board comprised a terminal portion having a first contact formed as a printed conductor in said other end portion,
    wherein the connector has an insertion slot into which the terminal portion is inserted and a second contact fitted inside the insertion slot and connected to the first contact,
    wherein a reinforcing plate is bonded on a face of the terminal portion opposite to a face thereof on which the first contact is formed, and
    an ear-like piece that makes contact with an opening rim of the insertion slot in the connector is formed in a position a predetermined distance inward from a tip end of the terminal portion in a length direction of the backlight flexible printed circuit board for permitting a good positional alignment between the first and the second contacts,
    wherein the backlight flexible printed circuit board comprises a rectilinear base portion extending linearly in a direction the backlight flexible printed circuit board is led out and a curved portion formed in a semicircular or semielliptic shape extending from the base portion, and
    the terminal portion is formed at a tip end of the curved portion so that the terminal portion is inserted into the insertion slot in a direction perpendicular to a direction in which the rectilinear base extends.

2. The connecting device of a flexible printed circuit board according to claim 1,
    wherein two of the ear-like piece are formed one in each side-edge portion of the flexible printed circuit board, and each ear-like piece are formed so wide as to be holdable between human fingers or with a comparable tool.

3. The connecting device of a flexible printed circuit board according to claim 1,
    wherein the connector has pressure-fixing means for pressing and thereby fixing the terminal portion.

4. A connecting device of a flexible printed circuit board comprising:
    a backlight flexible printed circuit board having one end portion thereof connected to a backlight unit for illuminating a display panel and another end portion thereof led out therefrom; and
    a driving flexible printed circuit board having one end portion thereof connected to the display panel for driving the display panel and the other end portion thereof led out therefrom and having a connector to which the other end portion of the backlight flexible printed circuit board is connected,
    wherein the backlight flexible printed circuit board comprises a terminal portion having a first contact formed as a printed conductor in said other end portion, wherein the connector has an insertion slot into which the terminal portion is inserted and a second contact fitted inside the insertion slot and connected to the first contact, wherein a reinforcing plate is bonded on a face of the terminal portion opposite to a face thereof on which the first contact is formed, and an ear-like piece that makes contact with an opening rim of the insertion slot in the connector is formed in a position a predetermined distance inward from a tip end of the terminal portion in a length direction of the backlight flexible printed circuit board for permitting a good positional alignment between the first and the second contacts, wherein the backlight flexible printed circuit board comprises a rectilinear base portion extending linearly in a direction the backlight flexible printed circuit board is led out and a curved portion formed in a semicircular or semielliptic shape extending from the base portion, and the terminal portion is formed at a tip end of the curved portion so that the terminal portion is inserted into the insertion slot in a direction perpendicular to a direction in which the rectilinear base extends, and wherein the backlight and driving flexible printed circuit boards are led out in an identical direction with one of the flexible printed circuit boards placed on top of the other in a cross sectional view, the one and the other of the flexible printed circuit boards switch positions at the curved portion, and the one and the other of the flexible printed circuit boards are partially fixed to each other immediately before the one and the other switch the positions.

5. The connecting device of a flexible printed circuit board according to claim 4, wherein two of the ear-like piece are formed one in each side-edge portion of the flexible printed circuit board, and each ear-like piece are formed so wide as to be holdable between human fingers or with a comparable tool.

6. The connecting device of a flexible printed circuit board according to claim 4, wherein the connector has pressure-fixing means for pressing and thereby fixing the terminal portion.

* * * * *